(12) United States Patent
Kishida et al.

(10) Patent No.: US 11,569,794 B2
(45) Date of Patent: Jan. 31, 2023

(54) SURFACE ACOUSTIC WAVE RESONATOR, ITS MANUFACTURING METHOD, AND RADIO CIRCUIT

(71) Applicant: THE JAPAN STEEL WORKS, LTD., Tokyo (JP)

(72) Inventors: Kazuhito Kishida, Tokyo (JP); Shoji Kakio, Kofu (JP); Kengo Ogawa, Tokyo (JP); Hiroaki Yokota, Tokyo (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 4 days.

(21) Appl. No.: 17/390,911

(22) Filed: Jul. 31, 2021

(65) Prior Publication Data
US 2022/0069796 A1  Mar. 3, 2022

(30) Foreign Application Priority Data
Aug. 28, 2020 (JP) .............................. JP2020-144271

(51) Int. Cl.
| | |
|---|---|
| H03H 9/02 | (2006.01) |
| H03F 3/19 | (2006.01) |
| H03H 9/145 | (2006.01) |
| H03H 9/56 | (2006.01) |
| H04B 1/40 | (2015.01) |
| H03H 3/08 | (2006.01) |

(52) U.S. Cl.
CPC .......... *H03H 9/02551* (2013.01); *H03F 3/19* (2013.01); *H03H 3/08* (2013.01); *H03H 9/145* (2013.01); *H03H 9/56* (2013.01); *H04B 1/40* (2013.01); *H03F 2200/171* (2013.01); *H03F 2200/451* (2013.01)

(58) Field of Classification Search
CPC ......... H03F 2200/171; H03F 2200/451; H03F 3/19; H03F 3/195; H03H 3/08; H03H 9/02551; H03H 9/02559; H03H 9/02574; H03H 9/02834; H03H 9/145; H03H 9/56; H04B 1/40
See application file for complete search history.

(56) References Cited

U.S. PATENT DOCUMENTS

| | | | |
|---|---|---|---|
| 2018/0048282 A1* | 2/2018 | Kurimoto | ................ H03H 9/25 |
| 2020/0028486 A1* | 1/2020 | Kishino | ............. H03H 9/02866 |
| 2020/0127634 A1 | 4/2020 | Kurimoto et al. | |
| 2021/0108338 A1 | 4/2021 | Kurimoto et al. | |

FOREIGN PATENT DOCUMENTS

| | | |
|---|---|---|
| JP | 2018-026695 A | 2/2018 |
| JP | 2019-004308 A | 1/2019 |
| JP | 2019-145920 A | 8/2019 |

\* cited by examiner

*Primary Examiner* — Nguyen T Vo
(74) *Attorney, Agent, or Firm* — SGPatents PLLC

(57) ABSTRACT

In a surface acoustic wave resonator according to an embodiment, a quartz-crystal substrate includes an AT-cut 0° X-propagation first quartz-crystal substrate and a Z-cut second quartz-crystal substrate bonded over the first quartz-crystal substrate. A propagation direction of a surface acoustic wave in the second quartz-crystal substrate is inclined from an X-axis of a crystal by 27 to 33°, 87 to 93°, or 147 to 153°, and a thickness of the second quartz-crystal substrate is 0.2 to 1.0 times a wavelength of the surface acoustic wave.

13 Claims, 12 Drawing Sheets

SURFACE ACOUSTIC WAVE RESONATOR, ITS MANUFACTURING METHOD, AND RADIO CIRCUIT

INCORPORATION BY REFERENCE

This application is based upon and claims the benefit of priority from Japanese patent application No. 2020-144271, filed on Aug. 28, 2020, the disclosure of which is incorporated herein in its entirety by reference.

BACKGROUND

The present disclosure relates to a surface acoustic wave resonator, its manufacturing method, and a radio circuit.

As mobile communication apparatuses such as mobile phones have evolved, there has been a demand for improving the performance of surface acoustic wave (SAW: Surface Acoustic Wave) filters. In a surface acoustic wave resonator constituting a part of such an SAW filter, it has been required, for example, to widen a bandwidth by improving an electromechanical coupling coefficient $K^2$, and to lower the absolute value of a temperature coefficient of frequency (TCF: Temperature Coefficient of Frequency). As disclosed in Japanese Unexamined Patent Application Publication Nos. 2018-026695, 2019-004308, and 2019-145920, the inventors of the present application have developed in the past surface acoustic wave resonators in which a piezoelectric crystal substrate is bonded over a quartz-crystal substrate.

SUMMARY

The inventors have found various problems in the development of surface acoustic wave resonators provided with a quartz-crystal substrate. Other problems to be solved and novel features will become apparent from descriptions in this specification and accompanying drawings.

In a surface acoustic wave resonator according to an embodiment, a quartz-crystal substrate includes an AT-cut 0° X-propagation first quartz-crystal substrate, and a Z-cut second quartz-crystal substrate bonded over the first quartz-crystal substrate. A propagation direction of a surface acoustic wave in the second quartz-crystal substrate is inclined from an X-axis of a crystal by 27 to 33°, 87 to 93°, or 147 to 153°, and a thickness of the second quartz-crystal substrate is 0.2 to 1.0 times a wavelength of the surface acoustic wave.

According to the embodiment, it is possible to provide an excellent surface acoustic wave resonator.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Specific embodiments are explained hereinafter in detail with reference to the drawings. However, the present disclosure is not limited to the below-shown embodiments. Further, the following descriptions and the drawings are simplified as appropriate for clarifying the explanation.

First Embodiment

<Configuration of Radio Circuit Using Surface Acoustic Wave Resonator>

Figure 1:
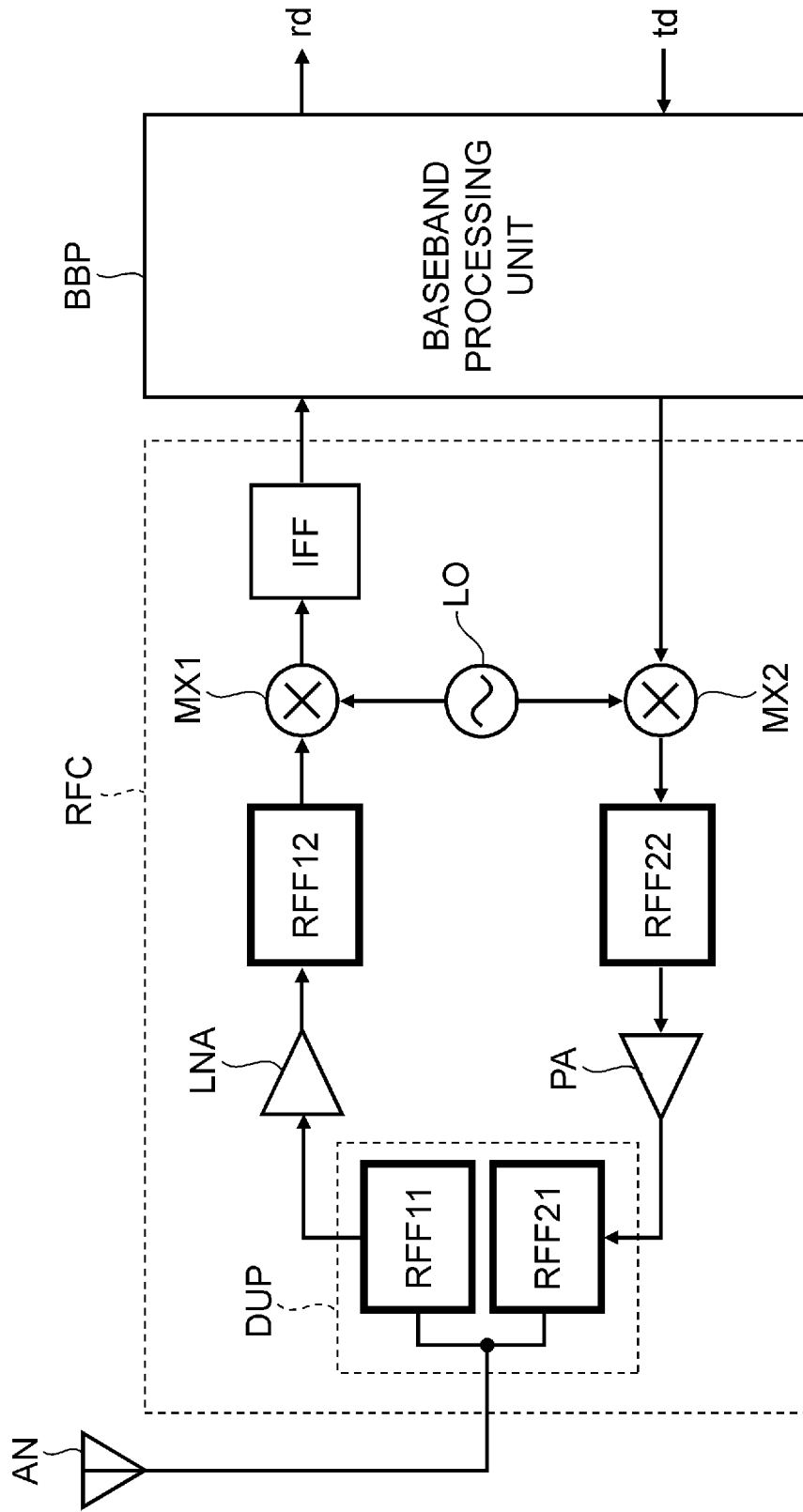
FIG. 1 is a block diagram showing an example of a configuration of a radio circuit using a surface acoustic wave resonator according to a first embodiment.

Firstly, a configuration of a radio circuit using a surface acoustic wave resonator according to a first embodiment will be described with reference to FIG. 1. FIG. 1 is a block diagram showing an example of a configuration of a radio circuit using a surface acoustic wave resonator according to the first embodiment. The radio circuit RFC shown in FIG. 1 is a radio transmitting/receiving circuit, and is used, for example, in a mobile phone. Note that the radio circuit shown in FIG. 1 shows just an example of the use of a surface acoustic wave resonator, and the use of the surface acoustic wave resonator is not limited to any particular use.

Firstly, an overview of the radio circuit RFC will be described.

The radio circuit RFC wirelessly receives a reception radio-frequency signal through an antenna AN, generates a reception IQ signal from the reception radio-frequency signal, and outputs the generated reception IQ signal to a baseband processing unit BBP. Meanwhile, the radio circuit RFC generates a transmission radio-frequency signal from a transmission IQ signal acquired from the baseband processing unit BBP, and wirelessly transmits the generated transmission radio-frequency signal through the antenna AN.

Note that the baseband processing unit BBP decodes the reception IQ signal acquired from the radio circuit RFC into reception data rd, and outputs the reception data rd to an external circuit (not shown) such as an audio circuit. Meanwhile, the baseband processing unit BBP encodes transmission data td acquired from an external circuit into a transmission IQ signal, and outputs the transmission IQ signal to the radio circuit RFC.

Next, details of the radio circuit RFC will be described.

As shown in FIG. 1, the radio circuit RFC includes a duplexer DUP, a low noise amplifier LNA, a power amplifier PA, a reception radio-frequency filter RFF12, a transmission radio-frequency filter RFF22, a radio-frequency mixer RFM, an intermediate-frequency filter IFF, and a local oscillator LO. Note that the duplexer DUP includes a reception radio-frequency filter RFF11 and a transmission radio-frequency filter RFF21.

A flow of reception data rd will be described hereinafter.

A reception radio-frequency signal received by the antenna AN is input to the low noise amplifier (the first amplifier) LNA through the reception radio-frequency filter RFF11 of the duplexer DUP, and amplified by the low noise amplifier LNA.

The amplified reception radio-frequency signal is input to a reception mixer MX1 through the reception radio-frequency filter RFF12. In the reception mixer MX1, the amplified reception radio-frequency signal is mixed with a frequency signal output from the local oscillator LO and down-converted into a reception IQ signal. The reception IQ signal output from the reception mixer MX1 is input to the baseband processing unit BBP through the intermediate-frequency filter IFF, and is decoded into reception data rd by the baseband processing unit BBP.

Note that the intermediate-frequency filter IFF may be included in the baseband processing unit BBP.

Next, a flow of transmission data td will be described.

Transmission data td input from an external circuit is encoded into a transmission IQ signal by the baseband processing unit BBP. The transmission IQ signal output from the baseband processing unit BBP is input to a transmission mixer MX2. In the transmission mixer MX2, the transmission IQ signal is mixed with a frequency signal output from the local oscillator LO and up-converted into a transmission radio-frequency signal.

The transmission radio-frequency signal is input to the power amplifier (the second amplifier) PA through the transmission radio-frequency filter RFF22, and is amplified by the power amplifier PA. The amplified transmission radio-frequency signal passes through the transmission radio-frequency filter RFF21 of the duplexer DUP, and is wirelessly transmitted from the antenna AN. Note that the propagation of the transmission radio-frequency signal, which is wirelessly transmitted from the antenna AN, to the low noise amplifier LNA is suppressed by the duplexer DUP (i.e., the reception radio-frequency filter RFF11 and the transmission radio-frequency filter RFF21).

Note that a surface acoustic wave resonator according to the first embodiment is used in at least one of the reception radio-frequency filters RFF11 and RFF12 and the transmission radio-frequency filters RFF21 and RFF22. The center frequencies of signals which the reception radio-frequency filters RFF11 and RFF12 and the transmission radio-frequency filters RFF21 and RFF22 let pass therethrough are not limited to any particular frequencies, and are, for example, 700 MHz to 3 GHz.

Further, the reception radio-frequency filters RFF11 and RFF12 and the transmission radio-frequency filters RFF21 and RFF22 are formed by, for example, a plurality of surface acoustic wave resonators whose resonance frequencies are slightly shifted from one another in order to obtain desired pass bandwidths. The surface acoustic wave resonator according to the first embodiment has a large electromechanical coupling coefficient $K^2$, and has a wide fractional bandwidth when it is used alone. Therefore, it is possible to widen the pass bandwidth of the surface acoustic wave resonators which constitute parts of the reception radio-frequency filters RFF11 and RFF12 and the transmission radio-frequency filters RFF21 and RFF22.

<Configuration of Surface Acoustic Wave Resonator>

Next, the configuration of the surface acoustic wave resonator according to the first embodiment will be described with reference to FIG. 2. The center frequency of the surface acoustic wave resonator according to this embodiment is not limited to any particular frequencies as described above, but it is suitable for a center frequency band of, for example, 700 MHz to 3 GHz.

Figure 2:
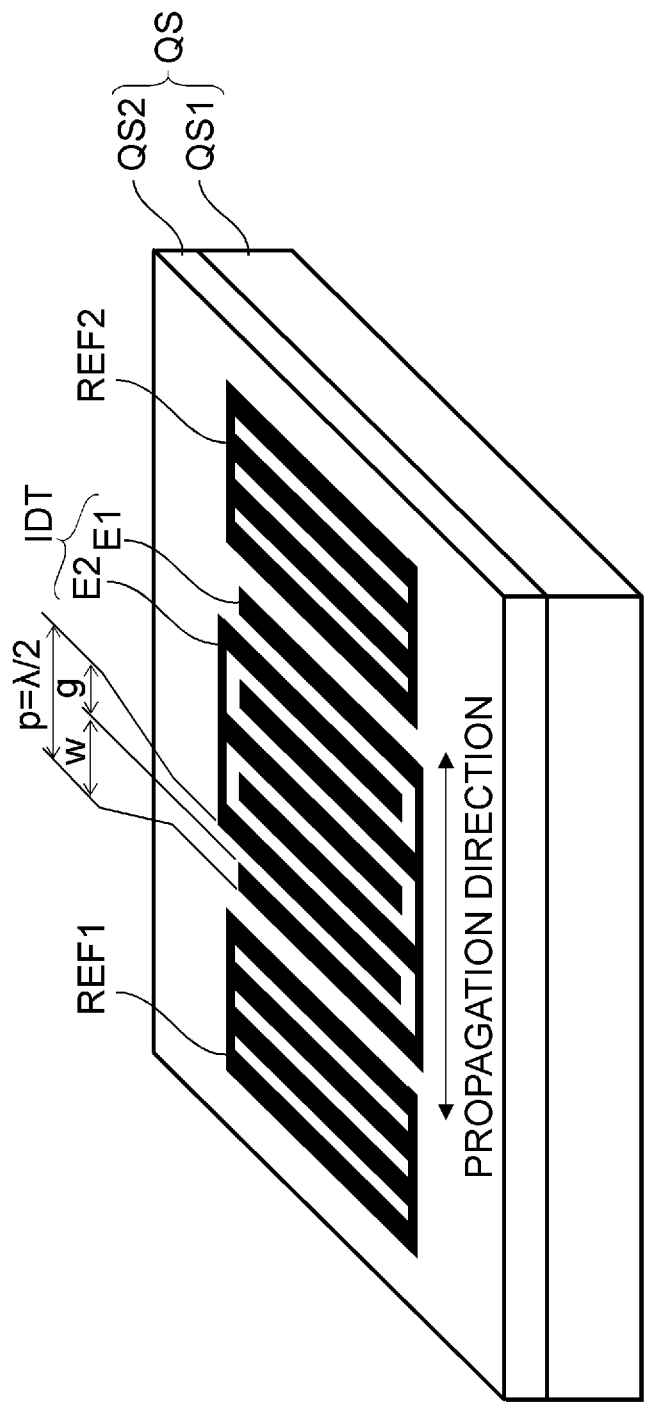
FIG. 2 is a perspective view showing an example of a configuration of the surface acoustic wave resonator according to the first embodiment.

FIG. 2 is a perspective view showing an example of the configuration of the surface acoustic wave resonator according to the first embodiment. As shown in FIG. 2, the surface acoustic wave resonator according to the first embodiment includes a quartz-crystal substrate QS, an IDT (Interdigital Transducer) electrode IDT, and reflectors REF1 and REF2.

As shown in FIG. 2, the IDT electrode IDT and the reflectors REF1 and REF2 are formed over the quartz-crystal substrate QS. The surface acoustic wave resonator shown in FIG. 2 is a one-port surface acoustic wave resonator in which one IDT electrode IDT is disposed between two reflectors REF1 and REF2.

Note that the surface acoustic wave resonator may be a two-port surface acoustic wave resonator in which two IDT electrodes are disposed between two reflectors REF1 and REF2. Further, the reflectors REF1 and REF2 are not indispensable.

In the surface acoustic wave resonator according to this embodiment, the quartz-crystal substrate QS includes two quartz-crystal substrates QS1 and QS2.

The quartz-crystal substrate (the first quartz-crystal substrate) QS1 is a single-crystal substrate made of quartz crystal ($SiO_2$) that is cut on a predetermined crystal plane. More specifically, the quartz-crystal substrate QS1 is an AT-cut quartz-crystal substrate in which the propagation direction of a leaky surface acoustic wave (LSAW: Leaky Surface Acoustic Wave) is inclined from the X-axis of the crystal by 0° (i.e., is not inclined from the X-axis of the crystal) (hereinafter also referred to as an AT-cut 0° X-propagation quartz-crystal substrate). The thickness of the quartz-crystal substrate QS1 is, for example, 5 to 500 μm. Among the rotated Y-cut and X-propagation quartz-crystal substrates, an AT-cut 0° X-propagation quartz-crystal substrate is one in which the phase velocity of a leaky surface acoustic wave is the highest. Hereinafter, the leaky surface acoustic wave is simply referred to as a surface acoustic wave.

As shown in FIG. 2, the quartz-crystal substrate (the second quartz-crystal substrate) QS2 is bonded over the quartz-crystal substrate QS1, which serves as a support substrate. The quartz-crystal substrates QS1 and QS2 are directly bonded to each other by, for example, a surface-activated bonding method. The quartz-crystal substrate QS2 is a single-crystal substrate made of quartz crystal ($SiO_2$) that is cut on a predetermined crystal plane. More specifically, the quartz-crystal substrate QS2 is a Z-cut quartz-crystal substrate in which the propagation direction of a surface acoustic wave is inclined from the X-axis of the crystal by 27 to 33° (Z-cut 27-33° X-propagation), 87 to 93° (Z-cut 87-93° X-propagation), or 147 to 153° (Z-cut 147-153° X-propagation). The propagation direction of a surface acoustic wave in the quartz-crystal substrate QS1 coincides with (i.e., in parallel with) that of a surface acoustic wave in the quartz-crystal substrate QS2.

The effect of the propagation direction (i.e., the propagation angle) of a surface acoustic wave in the quartz-crystal substrate QS2 on the electromechanical coupling coefficient $K^2$ will be described hereinafter with reference to FIG. 3.

Figure 3:
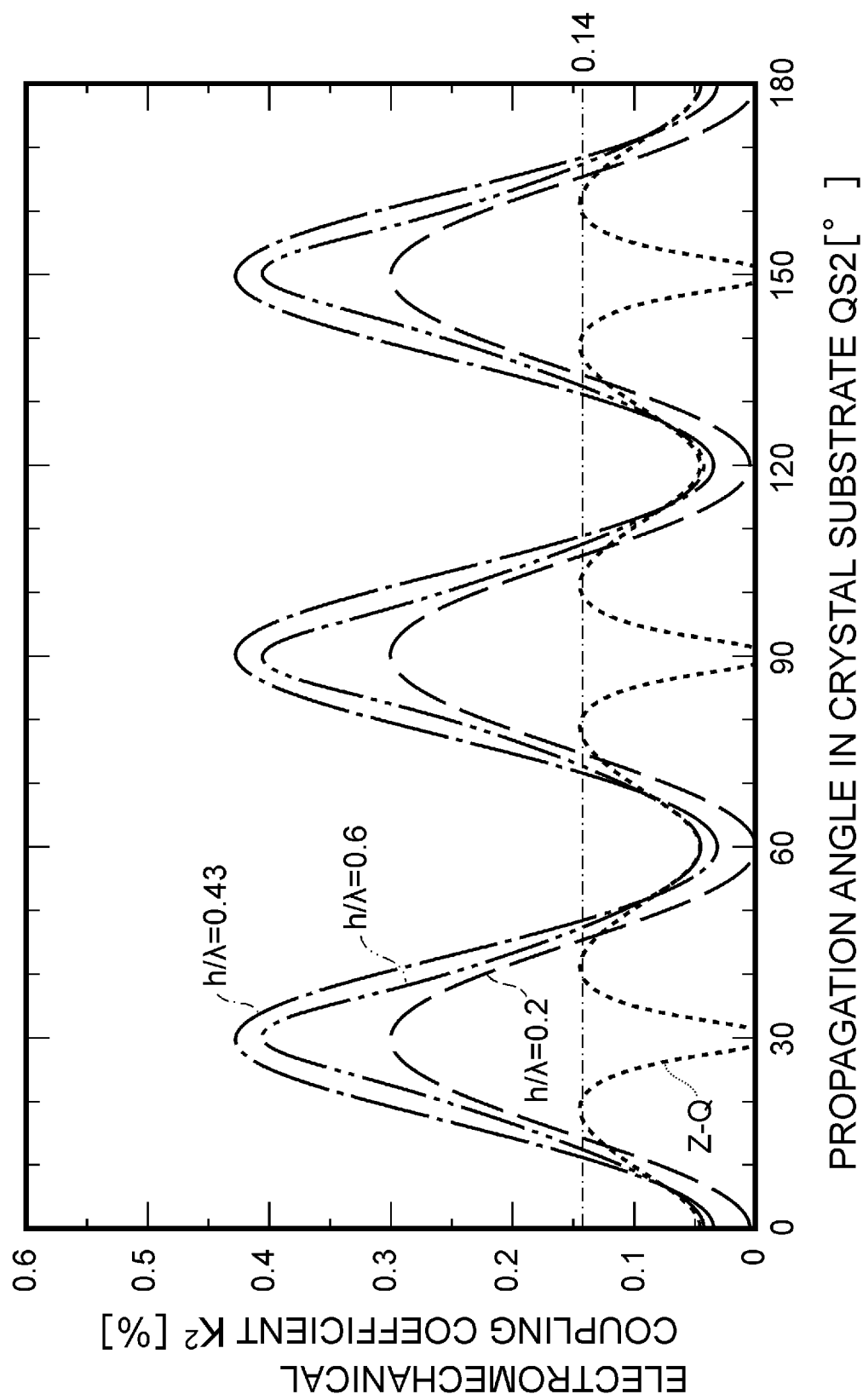
FIG. 3 is a graph showing changes in the electromechanical coupling coefficient $K^2$ with respect to the propagation angle of a surface acoustic wave in a Z-cut quartz-crystal substrate QS2 bonded to an AT-cut and 0° X-propagation quartz-crystal substrate QS1.

FIG. 3 is a graph showing changes in the electromechanical coupling coefficient $K^2$ with respect to the propagation angle of a surface acoustic wave in the Z-cut quartz-crystal substrate QS2 bonded to the AT-cut 0° X-propagation quartz-crystal substrate QS1. FIG. 3 shows a result of a theoretical analysis. The horizontal axis represents the propagation angle of a surface acoustic wave in the quartz-crystal substrate QS2, and the vertical axis represents the electromechanical coupling coefficient $K^2$ of the surface acoustic wave. The propagation angle is the angle of the propagation direction of a surface acoustic wave in the quartz-crystal substrate QS2 with respect to the X-axis of the crystal. FIG. 3 shows curves in the cases where the normalized plate thickness h/λ of the quartz-crystal substrate QS2, i.e., the plate thickness normalized based on the wavelength λ of the surface acoustic wave, is 0.2, 0.43 and 0.6. Further, FIG. 3 shows a curve of a Z-cut quartz-crystal substrate alone (indicated by "Z-Q" in FIG. 3).

As shown in FIG. 3, in the case of the Z-cut quartz-crystal substrate alone, the electromechanical coupling coefficient $K^2$ is minimized at propagation angles of 30°, 90° and 150°.

In contrast, in the case of the quartz-crystal substrate QS in which the Z-cut quartz-crystal substrate QS2 is bonded to the AT-cut 0° X-propagation quartz-crystal substrate QS1, the electromechanical coupling coefficient $K^2$ is maximized at the propagation angles of 30°, 90° and 150° irrespective of the normalized plate thickness of the quartz-crystal substrate QS2. Further, each of the curves periodically changes at an interval of a propagation angle of 60°, and has a line-symmetric shape with respect to each of the propagation angles of 30°, 90° and 150°.

Therefore, as described above, the propagation direction of a surface acoustic wave in the quartz-crystal substrate QS2 is inclined from the X-axis of the crystal by 27 to 33°, 87 to 93°, or 147 to 153°. As shown in FIG. 3, when the normalized plate thickness h/λ of the quartz-crystal substrate QS2 is 0.43, the peak value of the electromechanical coupling coefficient $K^2$ is 0.43%. This value is about three times the peak value of the electromechanical coupling coefficient $K^2$ of the Z-cut quartz-crystal substrate alone, which is 0.14%.

Next, the effect of the thickness of the quartz-crystal substrate QS2 on the electromechanical coupling coefficient $K^2$ of a surface acoustic wave will be described with reference to FIG. 4.

Figure 4:
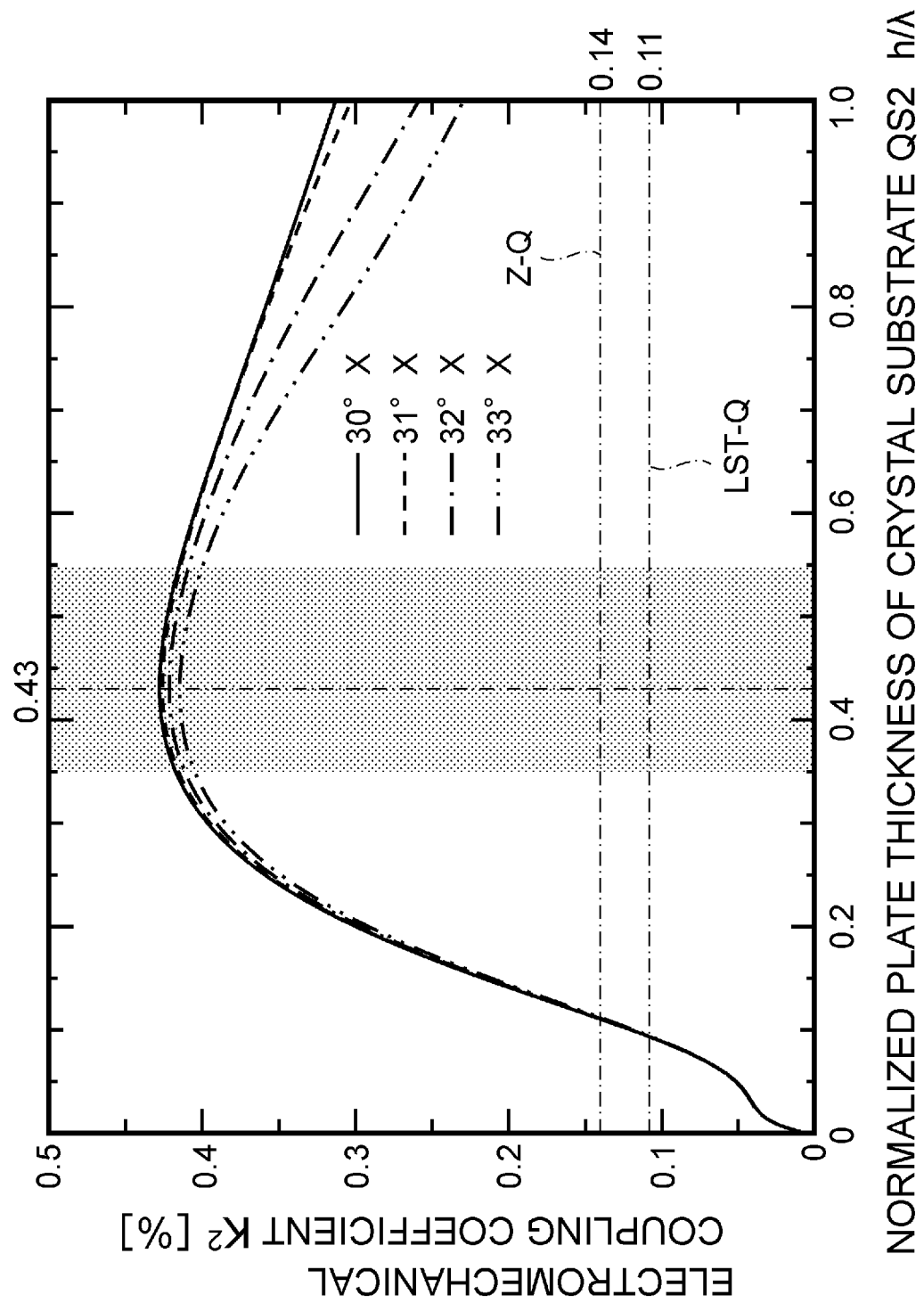
FIG. 4 is a graph showing changes in the electromechanical coupling coefficient $K^2$ of the surface acoustic wave with respect to the normalized plate thickness of a Z-cut quartz-crystal substrate QS2 bonded to the AT-cut 0° X-propagation quartz-crystal substrate QS1.

FIG. 4 is a graph showing changes in the electromechanical coupling coefficient $K^2$ of a surface acoustic wave with respect to the normalized plate thickness of the Z-cut quartz-crystal substrate QS2 bonded to the AT-cut 0° X-propagation quartz-crystal substrate QS1. FIG. 4 shows a result of a theoretical analysis. The horizontal axis represents the plate-thickness h of the quartz-crystal substrate QS2 normalized based on the wavelength λ, and the vertical axis represents the electromechanical coupling coefficient $K^2$(%) of the surface acoustic wave. FIG. 4 shows curves in the cases where the propagation angle of a surface acoustic wave in the quartz-crystal substrate QS2 with respect to the X-axis of the crystal is 30°, 31°, 32° and 33°.

Note that, as can be understood from FIG. 3, the behavior that is performed when the propagation angle is 30° is similar to those when the propagation angle is 90° and 150°. Further, the behavior that is performed when the propagation angle is 31° is similar to those when the propagation angle is 29°, 89°, 91°, 149° and 151°. The behavior that is performed when the propagation angle is 32° is similar to those when the propagation angle is 28°, 88°, 92°, 148° and 152°. The behavior that is performed when the propagation angle is 33° is similar to those when the propagation angle is 27°, 87°, 93°, 147° and 153°. That is, if the behaviors that are performed when the propagation angle is 30 to 33° are found, the behaviors that are performed when the propagation angle is 27 to 33°, 87 to 93°, and 147 to 153° can be obtained.

As shown in FIG. 4, at any of the propagation angles, the electromechanical coupling coefficient $K^2$ is maximized when the normalized plate thickness h/λ of the quartz-crystal substrate QS2 is 0.43. Further, the electromechanical coupling coefficient $K^2$ decreases as the propagation angle increases. However, there is substantially no difference in the value of the electromechanical coupling coefficient $K^2$ irrespective of the propagation angle when the normalized plate thickness is equal to or smaller than 0.43 at which the electromechanical coupling coefficient $K^2$ has the peak value. Meanwhile, when the normalized plate thickness exceeds 0.43, the difference in the value of the electromechanical coupling coefficient $K^2$, which is caused according to the propagation angle, increases as the normalized plate thickness increases.

As shown in FIG. 4, when the normalized plate thickness of the quartz-crystal substrate QS2 is in a range of 0.2 to 1.0, the value of the electromechanical coupling coefficient $K^2$ of the LST-cut quartz-crystal substrate alone (indicated by "LST-Q" in FIG. 4) exceeds 0.11%. Further, the peak value of the electromechanical coupling coefficient $K^2$ of the Z-cut quartz-crystal substrate alone (indicated by "Z-Q" in FIGS. 3 and 4) is 0.14%. Further, although it is not shown in the drawings, the value of the electromechanical coupling coefficient $K^2$ of an ST-cut quartz-crystal substrate, which is commonly used in a surface acoustic wave resonator, is 0.14%. Therefore, the thickness of the quartz-crystal substrate QS2 is adjusted to 0.2 to 1.0 times the wavelength λ of the surface acoustic wave.

Further, as shown by doted hatching in FIG. 4, an electromechanical coupling coefficient $K^2$ equal to or higher than about 0.4% can be obtained by adjusting the thickness of the quartz-crystal substrate QS2 to 0.35 to 0.55 times the wavelength λ of the surface acoustic wave.

As described above, the electromechanical coupling coefficient $K^2$ of the quartz-crystal substrate QS according to this embodiment is larger than those of the LST-cut quartz-crystal substrate and the ST-cut quartz-crystal substrate. Therefore, it is possible, by the quartz-crystal substrate QS according to this embodiment, to obtain a surface acoustic wave resonator that has a wide fractional bandwidth when it is used alone. As a result, it is possible to widen the pass bandwidths of the surface acoustic wave resonators which constitute parts of the reception radio-frequency filters RFF11 and RFF12 and the transmission radio-frequency filters RFF21 and RFF22 shown in FIG. 1.

Figure 5:
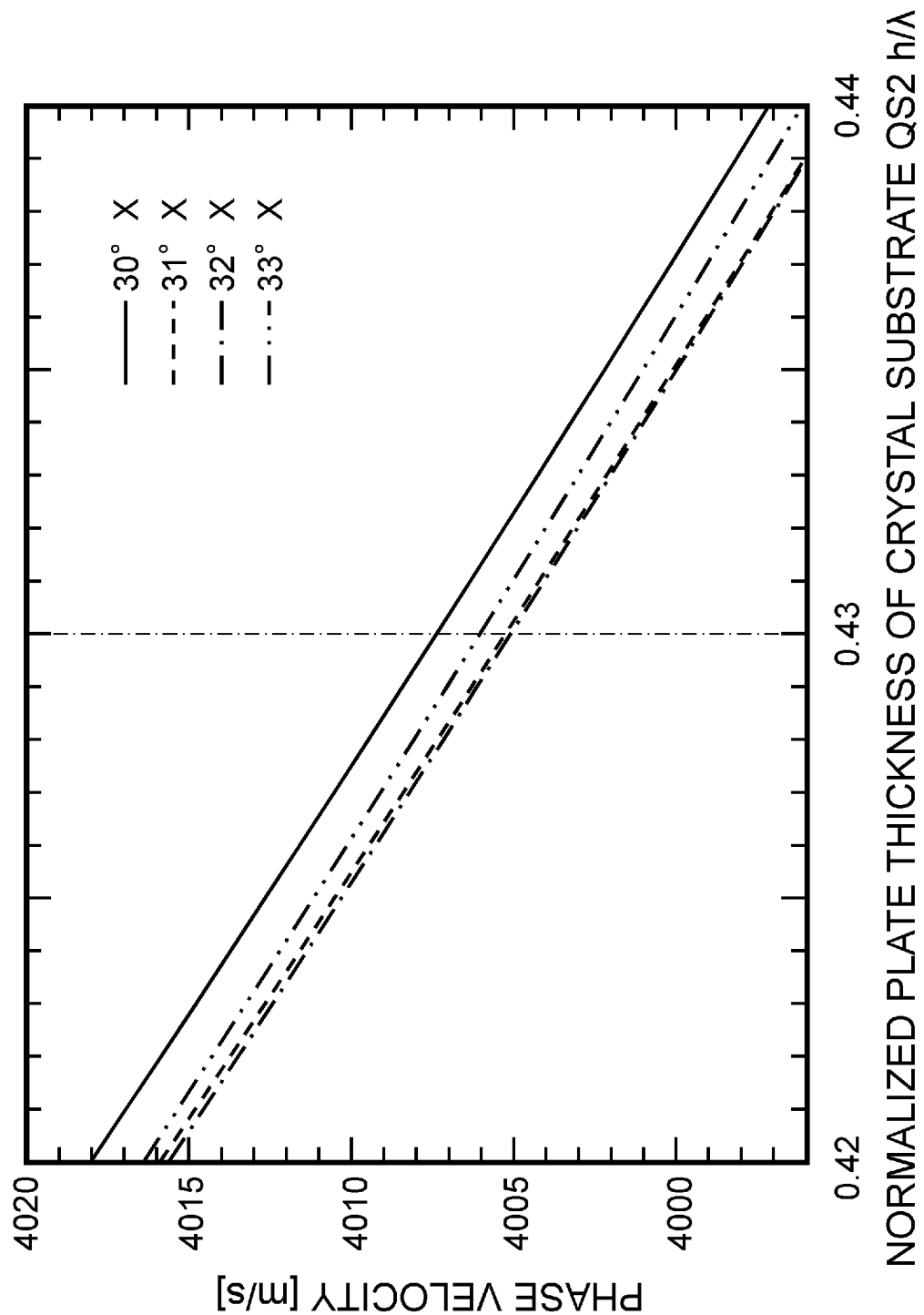
FIG. 5 is a graph showing changes in the phase velocity of the surface acoustic wave with respect to the normalized plate thickness of the Z-cut quartz-crystal substrate QS2 bonded to the AT-cut 0° X-propagation quartz-crystal substrate QS1.

Here, FIG. 5 is a graph showing changes in the phase velocity of a surface acoustic wave with respect to the normalized plate thickness of the Z-cut quartz-crystal substrate QS2 bonded to the AT-cut 0° X-propagation quartz-crystal substrate QS1. FIG. 5 is a result of a theoretical analysis of the phase velocity of a surface acoustic wave in a Free Surface. The horizontal axis represents the thickness h of the quartz-crystal substrate QS2 normalized based on the wavelength λ, and the vertical axis represents the phase velocity (m/s) of the surface acoustic wave. FIG. 5 shows curves in the cases where the propagation angle of a surface acoustic wave in the quartz-crystal substrate QS2 with respect to the X-axis of the crystal is 30°, 31°, 32° and 33°.

As shown in FIG. 5, at any of the propagation angles, the phase velocity of a surface acoustic wave decreases as the normalized plate thickness h/λ of the quartz-crystal substrate QS2 increases. Further, the phase velocity becomes the highest at the propagation angle of 30°, and decreases in the order of the propagation angles of 33°, 31° and 32°. However, when the normalized plate thickness shown in FIG. 5 is in a range of 0.42 to 0.44, the difference between the phase velocity at the propagation angle of 30°, at which the phase velocity is the highest, and the phase velocity at the propagation angle of 32°, at which the phase velocity is the smallest, is small, i.e., is about 2 to 3 m/s, and is substantially constant.

As shown in FIG. 5, the phase velocity of a surface acoustic wave in the Z-cut 30° X-propagation quartz-crystal substrate QS2 having a normalized plate thickness of 0.43, at which the electromechanical coupling coefficient $K^2$ has the peak value, is 4,007 m/s. This value is larger than the phase velocity of a surface acoustic wave in the LST-cut quartz-crystal substrate, which is 3,960 m/s, and is also larger than the phase velocity of a surface acoustic wave in the ST-cut quartz-crystal substrate commonly used in a surface acoustic wave resonator, which is 3,158 m/s, so it is advantageous for raising the frequency.

Further, although it is not shown in the drawings, the propagational attenuation of a surface acoustic wave in the Z-cut 30° X-propagation quartz-crystal substrate QS2 having the normalized plate thickness of 0.43, at which the electromechanical coupling coefficient $K^2$ has the peak value, is 0.02 dB/λ and is satisfactory. Similarly, the propagational attenuation of a surface acoustic wave in the Z-cut 32° X-propagation quartz-crystal substrate QS2 having the normalized plate thickness of 0.43 is 0.003 dB/λ and is more satisfactory.

The IDT electrode IDT is formed over the quartz-crystal substrate QS, i.e., over the quartz-crystal substrate QS2, and is formed by, for example, a metal film such as an aluminum (Al) film or a copper (Cu) film. The thickness of the metal film is, for example, several ten nanometers to several hundred nanometers.

As shown in FIG. 2, the IDT electrode IDT is composed of two comb-like electrodes E1 and E2. One of the electrodes E1 and E2 serves as an input electrode and the other electrode serves as an output electrode.

Specifically, each of the electrodes E1 and E2 includes a plurality of electrode fingers (comb tooth) that are arranged parallel to each other and are connected to one another at one end thereof. Further, the electrodes E1 and E2 are opposed to each other so that each of the electrode fingers of one of the electrodes E1 and E2 is inserted (i.e., interposed) between two adjacent electrode fingers of the other electrode. That is, the electrode fingers of the electrodes E1 and E2 are alternately arranged and parallel to each other.

As shown in FIG. 2, the electrode fingers of the electrodes E1 and E2 extend perpendicularly to the propagation direction of a surface acoustic wave in the surface of the quartz-crystal substrate QS2. Note that the width w of each of the electrode fingers of the electrodes E1 and E2 and the gap g between one of the electrode fingers of the electrode E1 and an adjacent electrode finger of the electrode E2 are constant. That is, the pitch p of the arrangement of the electrode fingers of the IDT electrode IDT (the electrode E1 and E2) is also constant, and is equal to the sum of the width w and the gap g of the electrode fingers. That is, a relation "p=w+g" holds.

Note that the wavelength λ of the surface acoustic wave is two times the pitch p (λ=2p) and is geometrically determined.

Further, since the center frequency f0 of the surface acoustic wave is expressed as "f0=v/λ" by using the velocity v and the wavelength λ of the surface acoustic wave, the below-shown Expression holds.

$$f0 = v/\lambda = v/2p = v/2(w+g)$$

The velocity v is determined based on the cutting plane of the quartz-crystal substrate QS2, the propagation direction, and the like, so that it is possible to raise the center frequency f0 of the surface acoustic wave by reducing the pitch p.

Note that the metallization ratio w/p is not limited to any particular ratio, and is, for example, in a range of 0.1 to 0.9. It has been known that the third harmonic is not excited when the ratio w/p is 0.5 (w/p=0.5). Further, assuming that the pitch p is constant (i.e., assuming that the center frequency f0 of the surface acoustic wave is constant), the larger the metallization ratio w/p is, the larger the width w of the electrode fingers becomes. Therefore, it is possible to lower the resistance.

Meanwhile, when the metallization ratio w/p exceeds 0.9, the gap g decreases, thus making the manufacturing of the IDT electrode IDT difficult. Further, when the metallization ratio w/p is smaller than 0.1, the width w decreases, thus making the manufacturing of the IDT electrode IDT difficult.

The width w of the electrode fingers of the IDT electrode IDT (the electrode E1 and E2) is, for example, in a range of 0.2 to 1.5 μm.

Note that in the example shown in FIG. 2, the number of electrode fingers of the electrode E1 is larger than that of electrode fingers of the electrode E2 by one, but may be equal to that of electrode fingers of the electrode E2. Further, the number of electrode fingers of the electrodes E1 and E2 is determined as desired. Further, two or more electrode fingers of one of the electrodes E1 and E2 may be inserted (i.e., interposed) between adjacent electrode fingers of the other of the electrodes E1 and E2.

The reflectors REF1 and REF2 are formed by, for example, the same metal film as that for the IDT electrode IDT.

As shown in FIG. 2, each of the reflectors REF1 and REF2 is composed of a plurality of strips that are arranged parallel to each other and connected to one another at both ends thereof. The strips are arranged at the same pitch p as that of the electrode fingers of the electrodes E1 and E2, and disposed in parallel with the electrode fingers of the electrodes E1 and E2. As the surface acoustic wave excited by the IDT electrode IDT is reflected by the reflectors REF1 and REF2, it becomes (or forms) a standing wave therebetween, so that a surface acoustic wave resonator having a high Q value and low loss can be obtained.

Further, since the surface acoustic wave resonator according to the first embodiment has a large reflection coefficient, it is possible to reduce the number of reflectors and reduce the area (i.e., the size) of the filter.

Note that the IDT electrode IDT and the reflectors REF1 and REF2 are formed over the quartz-crystal substrate QS2 after the quartz-crystal substrate QS2 is bonded over the quartz-crystal substrate QS1.

<Analysis of Resonance Characteristic by Simulation>

Figure 6:
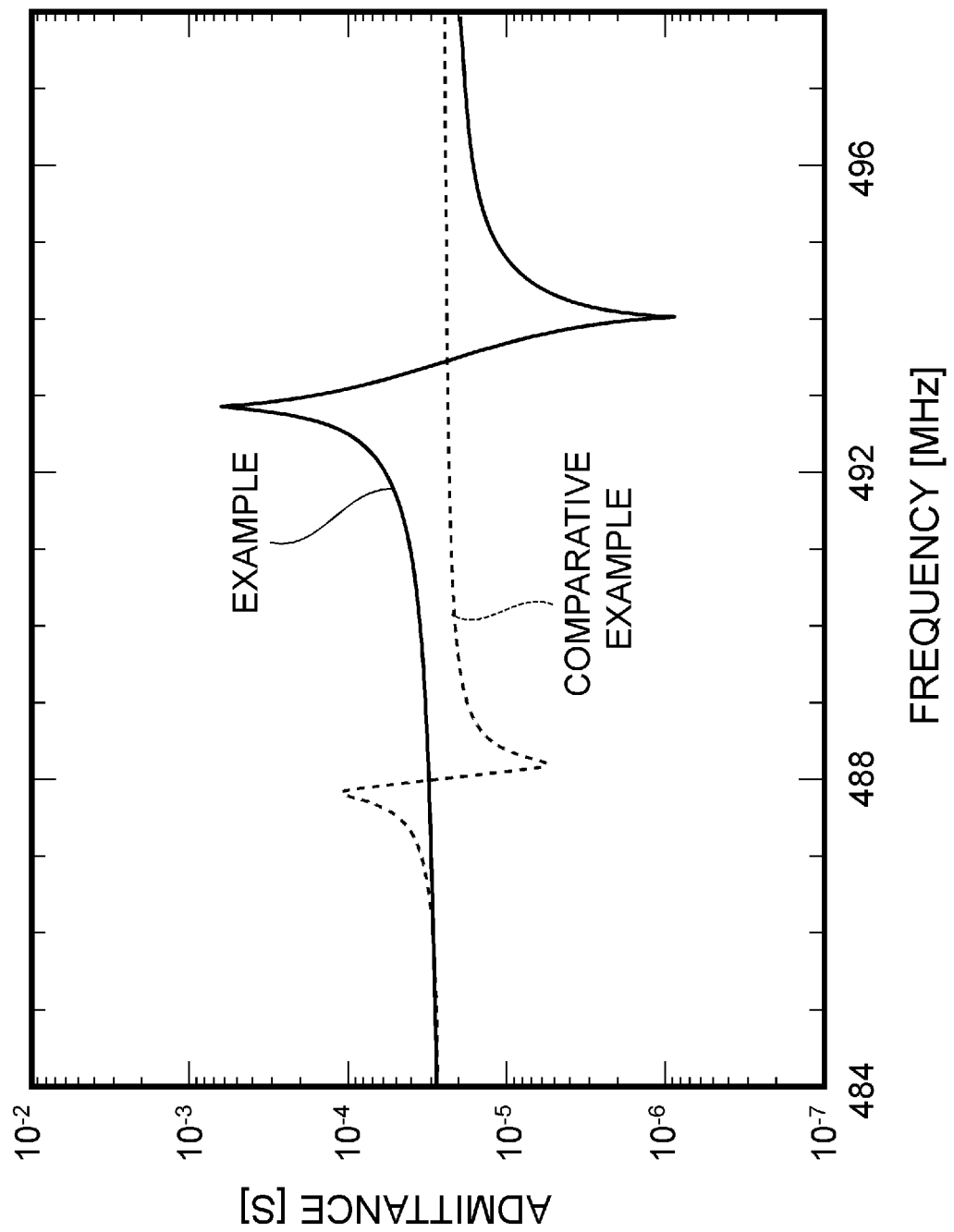
FIG. 6 is a graph showing a result of a resonance characteristic analysis by a simulation of a surface acoustic wave resonator according to the first embodiment.

Next, a result of a resonance characteristic analysis by a simulation of the surface acoustic wave resonator according to the first embodiment will be described with reference to FIG. 6. FIG. 6 is a graph showing a result of a resonance characteristic analysis by a simulation of the surface acoustic wave resonator according to the first embodiment. The horizontal axis represents the frequency (MHz) and the vertical axis represents the admittance (S). FIG. 6 shows a result of an analysis of an LST-cut quartz-crystal substrate alone (i.e., a comparative example) as well as a result of an analysis of a quartz-crystal substrate QS in which a Z-cut 32° X-propagation quartz-crystal substrate QS2 is bonded to an AT-cut 0° X-propagation quartz-crystal substrate QS1 (i.e., an example).

For the above-described quartz-crystal substrate QS and the LST-cut quartz-crystal substrate QS alone, their resonance characteristics were analyzed according to a finite element method (FEM: Finite Element Method) by using a Femtet manufactured by Murata Software Co., Ltd. The wavelength $\lambda$ (=2p) of a surface acoustic wave was 8 µm, and the thickness of the support substrate was 10$\lambda$. Further, as described above, the plate-thickness of the Z-cut 32° X-propagation quartz-crystal substrate QS2 was adjusted to 0.43$\lambda$ so that the electromechanical coupling coefficient $K^2$ has a peak value.

It was assumed that the IDT electrode IDT shown in FIG. 2 is composed of an aluminum (Al) film having a film-thickness of 0.1 µm and has an infinite periodic structure. Further, a perfect matched layer (PML: Perfect Matched Layer) was set in the bottom surface of the IDT electrode. The metallization ratio w/p was adjusted to 0.5. Then, a sine-wave AC (Alternating Current) voltage of ±1 V was applied to the IDT electrode IDT. The dielectric loss and the mechanical loss of each material were not taken into consideration.

As shown in FIG. 6, the admittance ratio of the surface acoustic wave resonator according to the example was 57 dB, and was larger than the admittance ratio of the surface acoustic wave resonator according to the comparative example, which was 26 dB.

Further, regarding the fractional bandwidth which is affected by the value of the electromechanical coupling coefficient $K^2$, the value in the surface acoustic wave resonator according to the example was 0.23%, and was about three times the value in the surface acoustic wave resonator according to the comparative example, which was 0.076%.

Further, regarding the resonance Q and the anti-resonance Q, which indicate the sharpness of the resonance and the anti-resonance, respectively, the values in the surface acoustic wave resonator according to the example were 5,420 and 5,880, respectively, and were higher than the values in the surface acoustic wave resonator according to the comparative example, which were 3,050 and 3,090, respectively.

Based on the above-described results of the analyses, it was confirmed that the surface acoustic wave resonator according to the example exhibited superior performance as compared to that of the surface acoustic wave resonator according to the comparative example.

Next, the effect of the thickness of the quartz-crystal substrate QS2 on the temperature coefficient of frequency (TCF) of a surface acoustic wave will be described with reference to FIG. 7.

Figure 7:
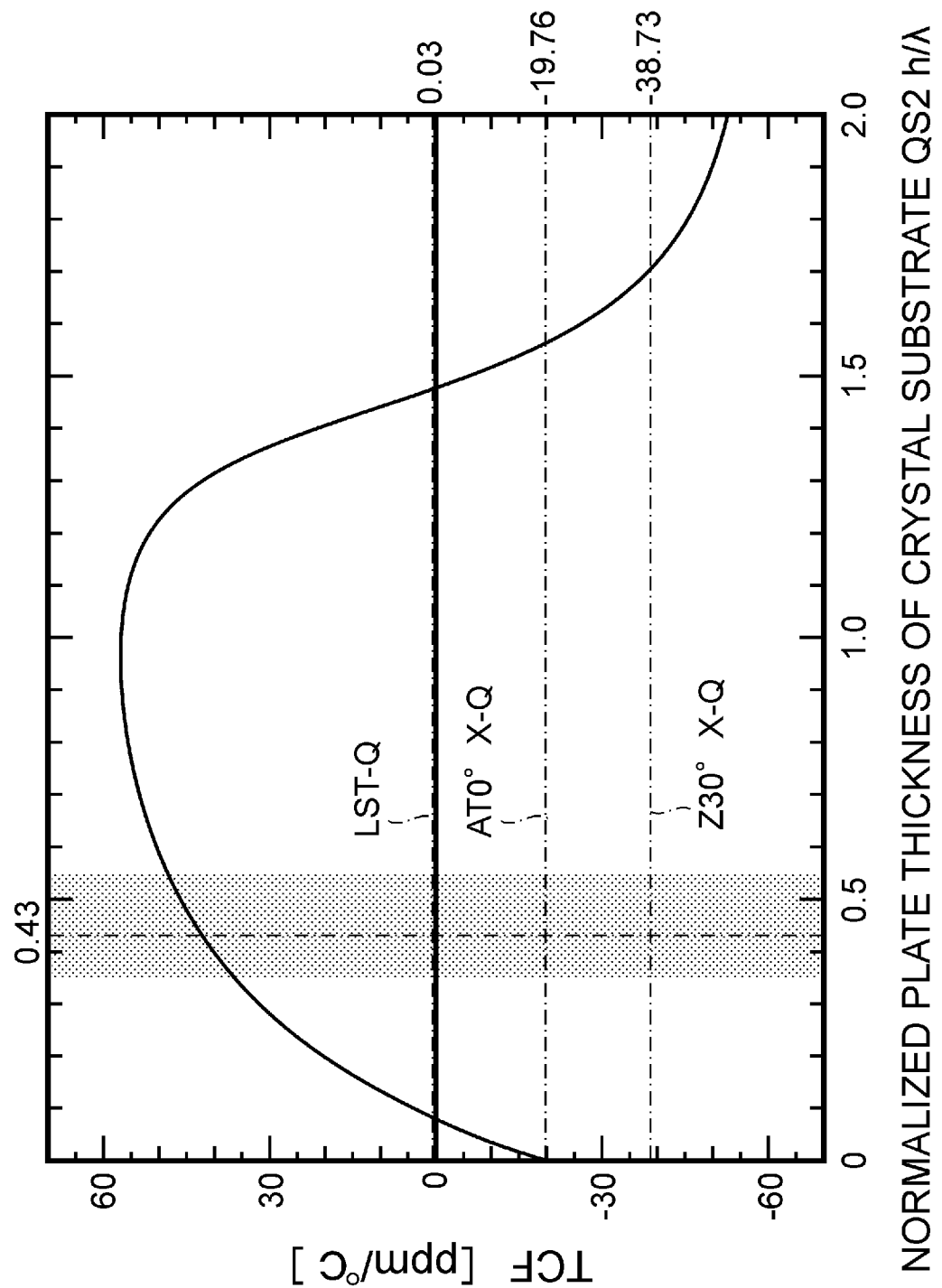
FIG. 7 is a graph showing changes in the temperature coefficient of frequency (TCF) of a surface acoustic wave with respect to the normalized plate thickness of the Z-cut 30° X-propagation quartz-crystal substrate QS2 bonded to the AT-cut 0° X-propagation quartz-crystal substrate QS1.

FIG. 7 is a graph showing changes in the TCF of a surface acoustic wave with respect to the normalized plate thickness of a Z-cut 30° X-propagation quartz-crystal substrate QS2 bonded to an AT-cut 0° X-propagation quartz-crystal substrate QS1. FIG. 7 shows a result of a theoretical analysis of the TCF of a surface acoustic wave in a Metallized Surface. The horizontal axis represents the thickness h of the quartz-crystal substrate QS2 normalized based on the wavelength $\lambda$, and the vertical axis represents the TCF (ppm/° C.) of the surface acoustic wave.

As shown in FIG. 7, the TCF monotonically increases from 20 ppm/° C. to 57 ppm/° C. in the above-described range of the normalized plate thickness h/$\lambda$ of the quartz-crystal substrate QS2, i.e., the above-described range of the normalized plate thickness h/$\lambda$ from 0.2 to 1.0.

Further, as shown by doted hatching in FIG. 7, the TCF monotonically increases from 36 ppm/° C. to 50 ppm/° C. in the range of the normalized plate thickness h/$\lambda$ of the quartz-crystal substrate QS2, i.e., the above-described range of the normalized plate thickness h/$\lambda$ from 0.35 to 0.55.

As shown in FIG. 7, the value of the TCF of the LST-cut quartz-crystal substrate (indicated by "LST-Q" in FIG. 7) is 0.03 ppm/° C., and is extremely good. In contrast, the value of the TCF of the quartz-crystal substrate QS according to this embodiment is slightly large.

Note that FIG. 7 also shows the values of the TCFs of the AT-cut 0° X-propagation quartz-crystal substrate alone (indicated by "AT0° X-Q" in FIG. 7) and the Z-cut 30° X-propagation quartz-crystal substrate alone (indicated by "Z30° X-Q" in FIG. 7). As shown in FIG. 7, the value of TCF of the AT-cut 0° X-propagation quartz-crystal substrate alone used in the quartz-crystal substrate QS1 is −19.76 ppm/° C. Meanwhile, the value of TCF of the Z-cut 30° X-propagation quartz-crystal substrate alone used in the quartz-crystal substrate QS2 is −38.73 ppm/° C. As described above, although the TCF of each of the quartz-crystal substrates QS1 and QS2 has a negative value when it is used alone, the TCF of the quartz-crystal substrate QS according to this embodiment, in which these quartz-crystal substrates QS1 and QS2 are bonded to each other, has a positive value in the range of the normalized plate thickness h/$\lambda$ from about 0.1 to 1.5.

Second Embodiment

Figure 8:
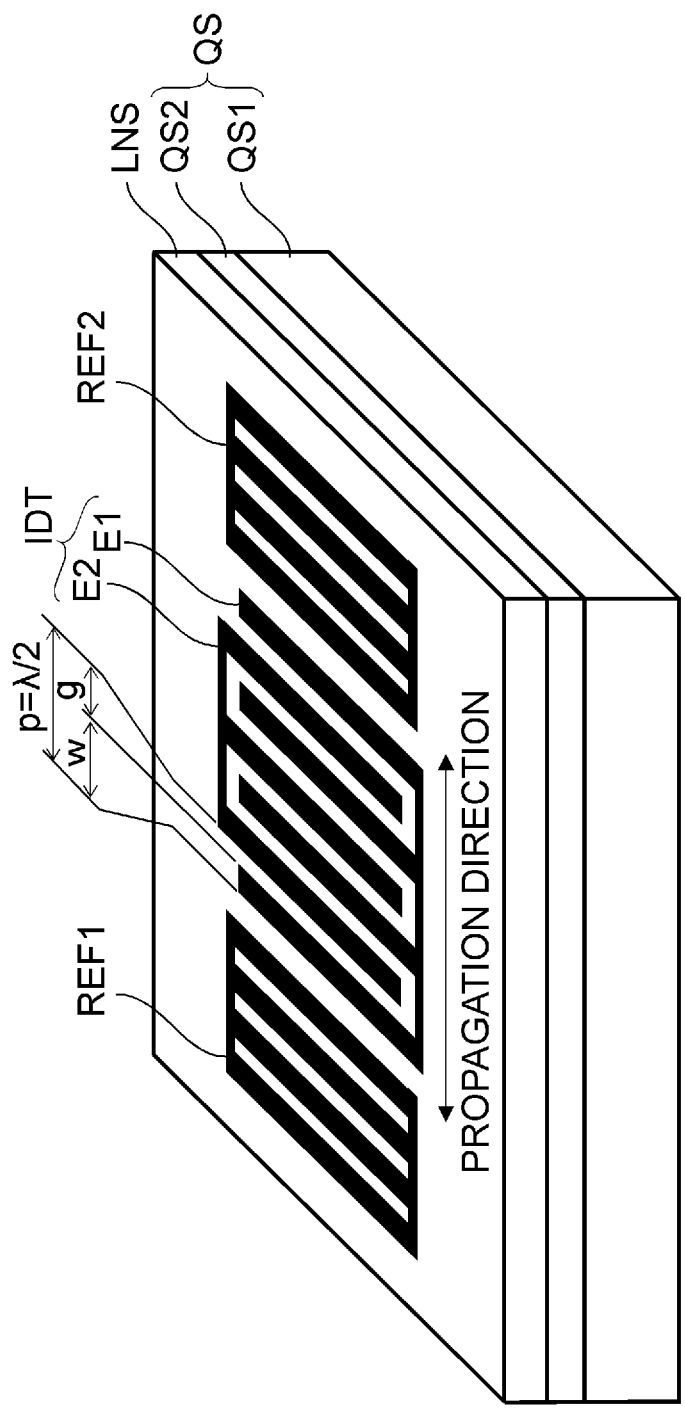
FIG. 8 is a perspective view showing an example of a configuration of a surface acoustic wave resonator according to a second embodiment.

Next, a configuration of a surface acoustic wave resonator according to a second embodiment will be described with reference to FIG. 8. FIG. 8 is a perspective view showing an example of a configuration of a surface acoustic wave resonator according to the second embodiment. As shown in FIG. 8, the surface acoustic wave resonator according to the second embodiment includes an LiNbO$_3$ substrate (an LN substrate) LNS in addition to the quartz-crystal substrate QS, the IDT electrode IDT, and the reflectors REF1 and REF2 shown in FIG. 2.

As shown in FIG. 8, the LN substrate LNS is bonded over the quartz-crystal substrate QS2. Further, the IDT electrode IDT and the reflectors REF1 and REF2 are formed over the LN substrate. In other words, the IDT electrode IDT and the reflectors REF1 and REF2 are formed above the quartz-crystal substrate QS with the LN substrate interposed therebetween.

Note that the IDT electrode IDT and the reflectors REF1 and REF2 are formed over the LN substrate after the LN substrate LNS is bonded over the quartz-crystal substrate QS2.

The LN substrate LNS is, for example, a single-crystal substrate made of $LiNbO_3$ that is cut on a predetermined crystal plane. More specifically, the LN substrate LNS is, for example, an LN substrate in which the cutting plane is inclined from the Y-axis of the crystal by 5 to 64° and the propagation direction of a surface acoustic wave is parallel to the X-axis of the crystal (hereinafter also referred to as a "5-64° Y-cut X-propagation LN substrate"). The propagation direction of a surface acoustic wave in the quartz-crystal substrate QS coincides with (i.e., in parallel with) the propagation direction of a surface acoustic wave in the LN substrate LNS.

The LN substrate LNS and the quartz-crystal substrate QS (i.e., the quartz-crystal substrate QS2) are directly bonded to each other by, for example, a surface-activated bonding method. Alternatively, the LN substrate LNS and the quartz-crystal substrate QS may be bonded to each other with an amorphous intermediate layer interposed therebetween. The amorphous intermediate layer is made of, for example, $SiO_2$ or $Al_2O_3$, and its thickness is, for example, 100 nm or smaller. The amorphous intermediate layer can be formed by known chemical vapor deposition or physical vapor deposition. For example, an amorphous intermediate layer is formed over a surface(s) of one or both of the LN substrate LNS and the quartz-crystal substrate QS, and then the LN substrate LNS and the quartz-crystal substrate QS are bonded to each other.

The effect of the thickness of the LN substrate LNS on the TCF of a surface acoustic wave will be described hereinafter with reference to FIG. 9.

Figure 9:
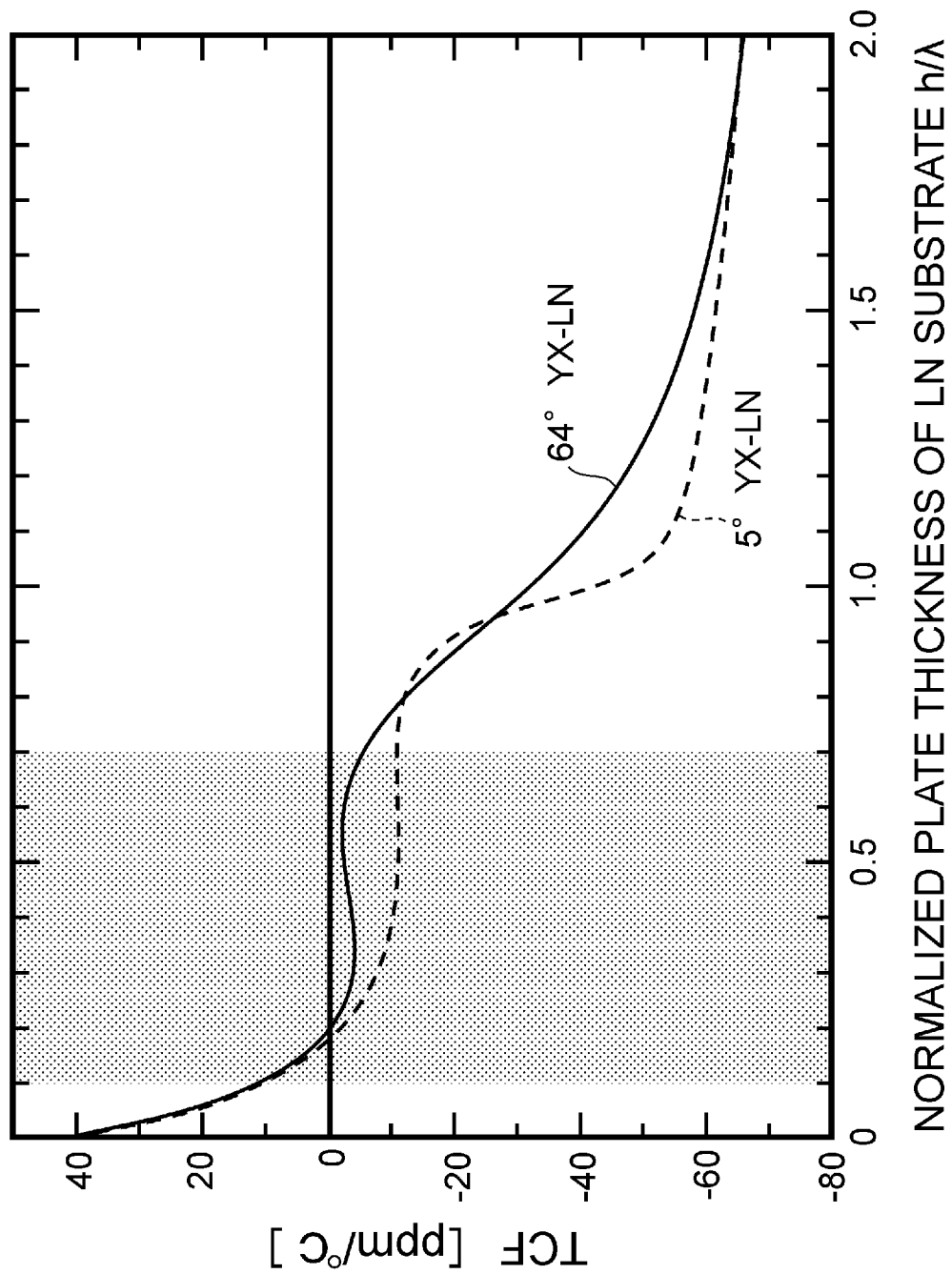
FIG. 9 is a graph showing changes in the TCF of a surface acoustic wave with respect to the normalized plate thickness of an LN substrate LNS bonded to a quartz-crystal substrate QS.

FIG. 9 is a graph showing changes in the TCF of a surface acoustic wave with respect to the normalized plate thickness of the LN substrate LNS bonded to the quartz-crystal substrate QS. FIG. 9 is a result of a theoretical analysis of the TCF of a surface acoustic wave in a free surface. The horizontal axis represents the thickness h of the LN substrate LNS normalized based on the wavelength $\lambda$, and the vertical axis represents the TCF (ppm/° C.) of the surface acoustic wave.

Note that the quartz-crystal substrate QS has a configuration in which a Z-cut 30° X-propagation quartz-crystal substrate QS2 having a normalized plate thickness of 0.43 is bonded to an AT-cut 0° X-propagation quartz-crystal substrate QS1. FIG. 9 shows curves in the cases where a 5° Y-cut X-propagation LN substrate LNS (indicated by "5° YX-LN" in FIG. 9) and a 64° Y-cut X-propagation LN substrate LNS (indicated by "64° YX-LN" in FIG. 9) are used as the LN substrate LNS.

As shown by doted hatching in FIG. 9, in a range of the normalized plate thickness h/$\lambda$ of the LN substrate LNS from 0.1 to 0.7, the value of the TCF falls in a range of about −10 to 10 ppm/° C. irrespective of which LN substrate LNS is used.

That is, it is possible, by bonding an LN substrate LNS having a normalized plate thickness h/$\lambda$ of 0.1 to 0.7 to a quartz-crystal substrate QS, to bring the absolute value of the TCF closer to zero than that of the TF of the surface acoustic wave resonator according to the first embodiment is.

Next, the effect of the thickness of the LN substrate LNS on the electromechanical coupling coefficient $K^2$ of a surface acoustic wave will be described with reference to FIG. 10.

Figure 10:
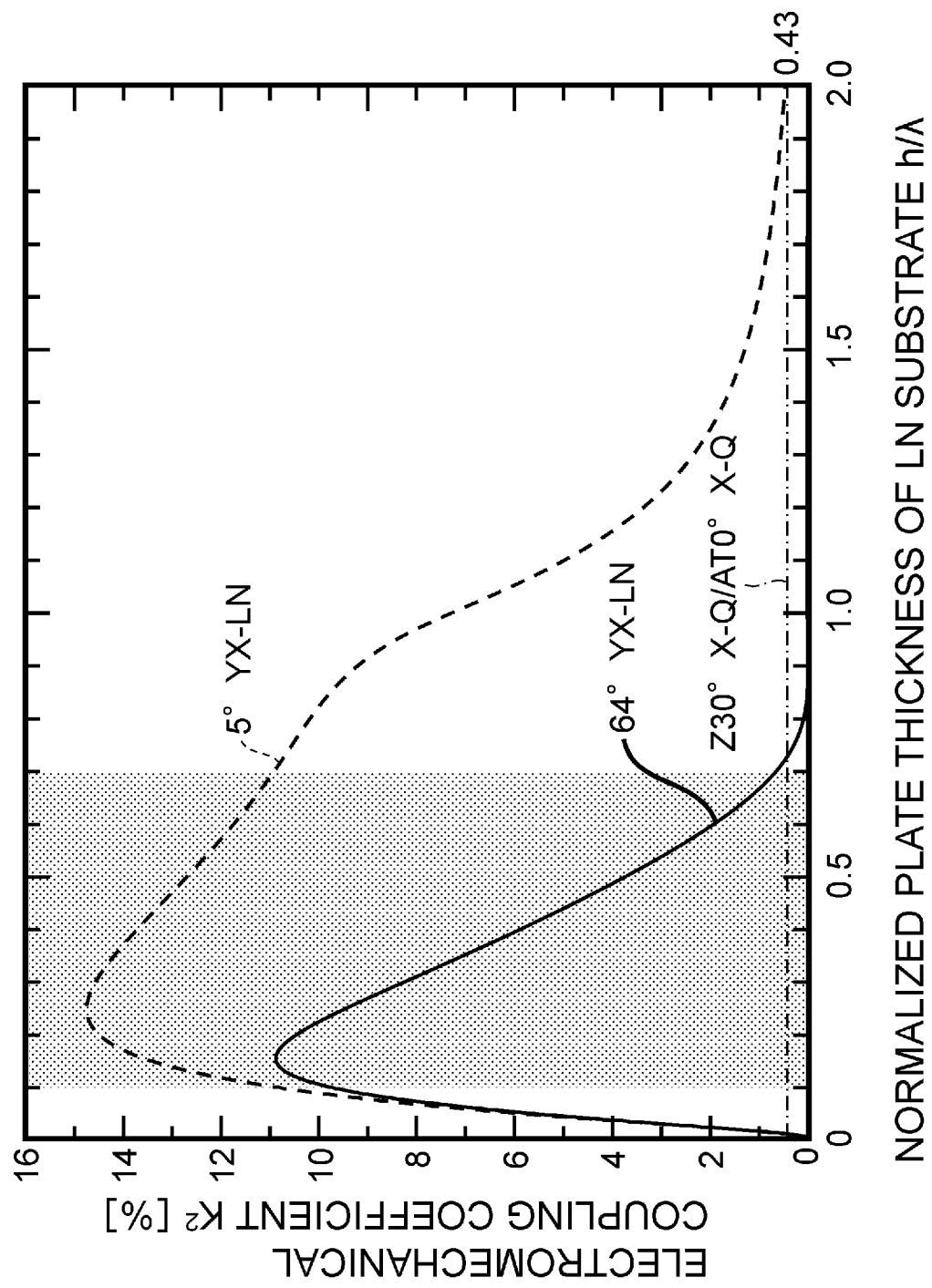
FIG. 10 is a graph showing changes in the electromechanical coupling coefficient $K^2$ of the surface acoustic wave with respect to the normalized plate thickness of the LN substrate LNS bonded to the quartz-crystal substrate QS.

FIG. 10 is a graph showing changes in the electromechanical coupling coefficient $K^2$ of a surface acoustic wave with respect to the normalized plate thickness of the LN substrate LNS bonded to the quartz-crystal substrate QS. FIG. 10 is a result of a theoretical analysis of the electromechanical coupling coefficient $K^2$ of a surface acoustic wave. The horizontal axis represents the thickness h of the LN substrate LNS normalized based on the wavelength $\lambda$, and the vertical axis represents the electromechanical coupling coefficient $K^2$(%) of the surface acoustic wave.

Note that the quartz-crystal substrate QS has a configuration in which a Z-cut 30° X-propagation quartz-crystal substrate QS2 having a normalized plate thickness of 0.43 is bonded to an AT-cut 0° X-propagation quartz-crystal substrate QS1. FIG. 10 shows curves in the cases where a 5° Y-cut X-propagation LN substrate LNS (indicated by "5° YX-LN" in FIG. 10) and a 64° Y-cut X-propagation LN substrate LNS (indicated by "64° YX-LN" in FIG. 10) are used as the LN substrate LNS.

As shown by doted hatching in FIG. 10, in a range of the normalized plate thickness h/$\lambda$ of the LN substrate LNS from 0.1 to 0.7, the value of the electromechanical coupling coefficient $K^2$ exceeds 0.43 irrespective of which LN substrate LNS is used. Note that the value of the electromechanical coupling coefficient $K^2$ of a quartz-crystal substrate QS (indicated by "Z30° X-Q/AT0° X-Q" in FIG. 10) in which a Z-cut 30° X-propagation quartz-crystal substrate QS2 having a normalized plate thickness of 0.43 is bonded to an AT-cut 0° X-propagation quartz-crystal substrate QS1 is 0.43. That is, FIG. 10 shows the maximum value of the electromechanical coupling coefficient $K^2$ of the surface acoustic wave resonator according to the first embodiment shown in FIG. 4.

As described above, it is possible, by bonding an LN substrate LNS having a normalized plate thickness h/$\lambda$ of 0.1 to 0.7 to a surface acoustic wave resonator (i.e., a quartz-crystal substrate QS) according to the first embodiment, to increase the electromechanical coupling coefficient $K^2$ of the surface acoustic wave even further.

As shown in FIG. 10, in the case of the 5° Y-cut X-propagation LN substrate LNS, the electromechanical coupling coefficient $K^2$ has a peak value (about 15%) at or near a normalized plate thickness of 0.25. Meanwhile, in the case of the 64° Y-cut X-propagation LN substrate LNS, the electromechanical coupling coefficient $K^2$ has a peak value (about 11%) at or near a normalized plate thickness of 0.15. That is, in the surface acoustic wave resonator according to this embodiment, it is possible to significantly increase the electromechanical coupling coefficient $K^2$ as compared to that in the surface acoustic wave resonator according to the first embodiment.

Based on the above-described matters, the thickness of the LN substrate LNS is adjusted to, for example, 0.1 to 0.7 times the wavelength $\lambda$ of the surface acoustic wave.

By the above-described configuration, in the surface acoustic wave resonator according to this embodiment, it is possible, without reducing the electromechanical coupling coefficient $K^2$, to reduce the absolute value of the TCF as compared to that in the surface acoustic wave resonator according to the first embodiment.

Figure 11:
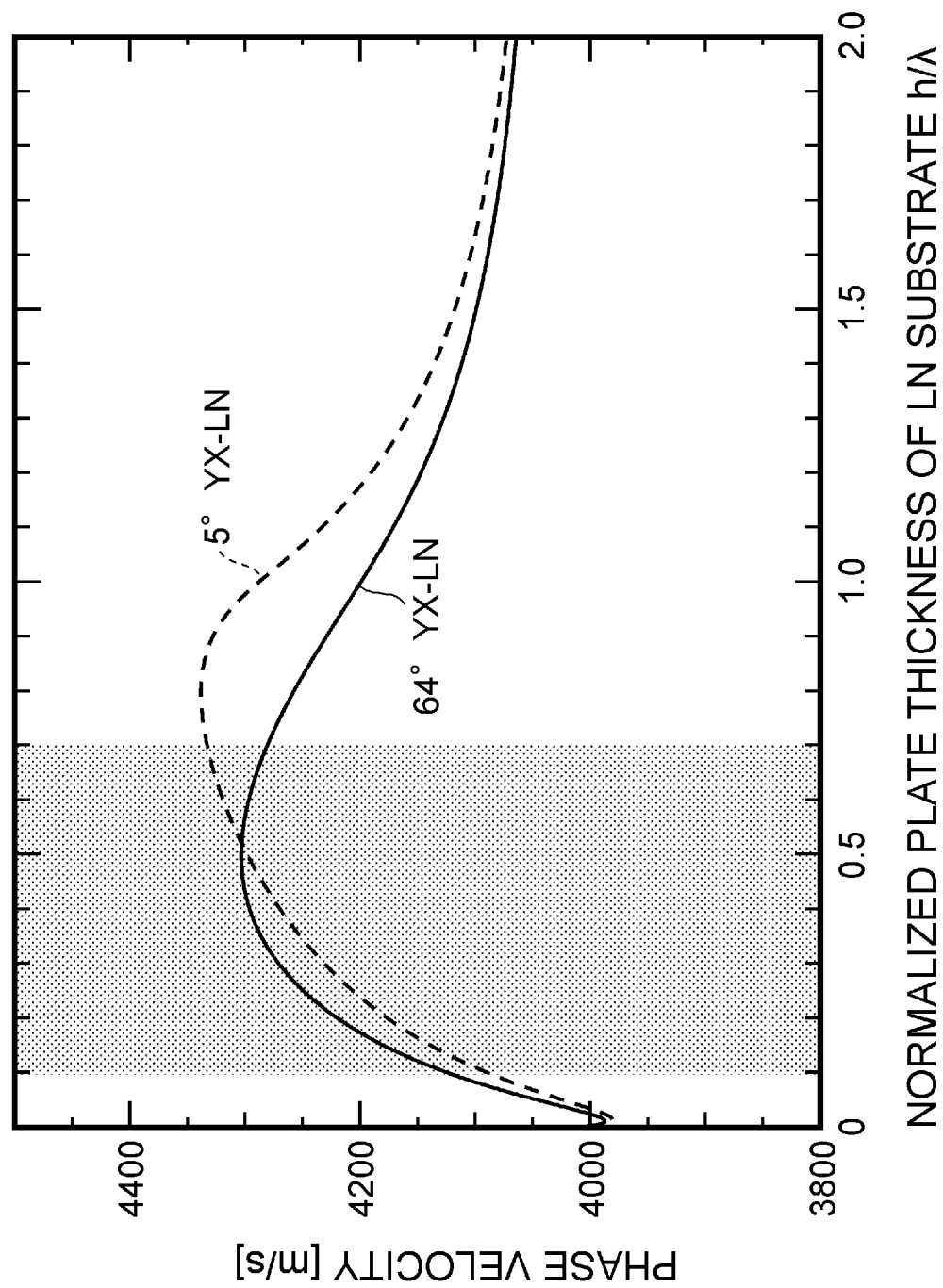
FIG. 11 is a graph showing changes in the phase velocity of the surface acoustic wave with respect to the normalized plate thickness of the LN substrate LNS bonded to the quartz-crystal substrate QS.

Here, FIG. 11 is a graph showing changes in the phase velocity of a surface acoustic wave with respect to the normalized plate thickness of the LN substrate LNS bonded to the quartz-crystal substrate QS. FIG. 11 is a result of a theoretical analysis of the phase velocity of a surface acoustic wave in a free surface. The horizontal axis represents the thickness h of the LN substrate LNS normalized based on the wavelength λ, and the vertical axis represents the phase velocity (m/s) of the surface acoustic wave.

Note that the quartz-crystal substrate QS has a configuration in which a Z-cut 30° X-propagation quartz-crystal substrate QS2 having a normalized plate thickness of 0.43 is bonded to an AT-cut 0° X-propagation quartz-crystal substrate QS1. FIG. 11 shows curves in the cases where a 5° Y-cut X-propagation LN substrate LNS (indicated by "5° YX-LN" in FIG. 11) and a 64° Y-cut X-propagation LN substrate LNS (indicated by "64° YX-LN" in FIG. 11) are used as the LN substrate LNS.

As shown by doted hatching in FIG. 11, in a range of the normalized plate thickness h/λ of the LN substrate LNS from 0.1 to 0.7, the phase velocity becomes larger than that of the surface acoustic wave resonator according to the first embodiment irrespective of which LN substrate LNS is used.

As described above, in the surface acoustic wave resonator according to this embodiment, it is also possible to increase the phase velocity as compared to that in the surface acoustic wave resonator according to the first embodiment. For example, as shown in FIG. 11, in a range of the normalized plate thickness h/λ of the LN substrate LNS from 0.1 to 0.7, the phase velocity can be increased to about 4,100 to 4,300 m/s. Therefore, the surface acoustic wave resonator according to this embodiment can be used, for example, in a high frequency band such as a 2 GHz band.

The rest of the configuration is similar to that of the surface acoustic wave resonator according to the first embodiment.

Third Embodiment

Figure 12:
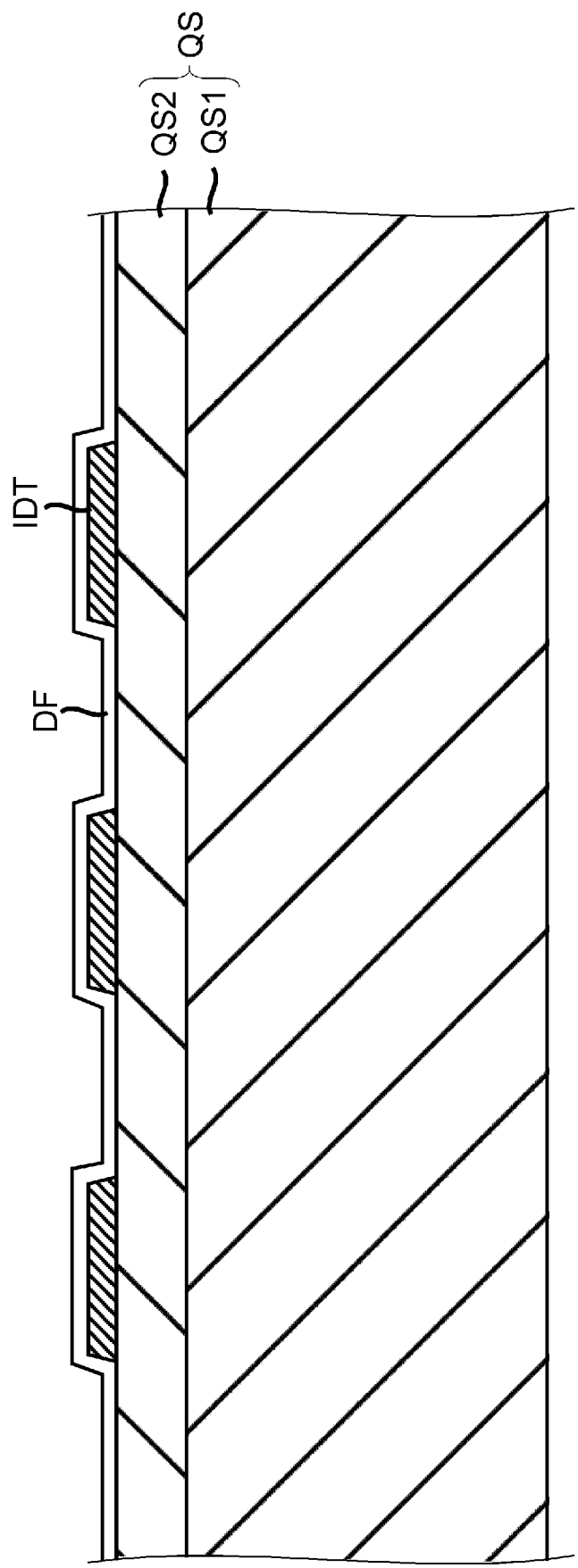
FIG. 12 is a partial cross-sectional view showing an example of a configuration of a surface acoustic wave resonator according to a third embodiment.

Next, a configuration of a surface acoustic wave resonator according to a third embodiment will be described with reference to FIG. 12. FIG. 12 is a partial cross-sectional view showing an example of a configuration of a surface acoustic wave resonator according to the third embodiment. As shown in FIG. 12, the surface acoustic wave resonator according to the third embodiment includes a dielectric film DF in addition to the quartz-crystal substrate QS, the IDT electrode IDT, and reflectors REF1 and REF2 shown in FIG. 2.

As shown in FIG. 12, the dielectric film DF is formed so as to cover the quartz-crystal substrate QS2 and the IDT electrode IDT.

Note that the dielectric film DF has a negative TCF. Examples of the dielectric film DF having a negative TCF include an $Al_2O_3$ film, a $Ta_2O_3$ film, a ZnO film, a $TiO_2$ film, an $LiTaO_3$ film, an $LiNbO_3$ film, a $PbTiO_3$ film, and a $BaTiO_3$ film. Among these films, the $Al_2O_3$ film can be easily formed by using a PVD method, a CVD method, or the like, and in which particles are less likely to be formed, so that its productivity is excellent. Further, the $Al_2O_3$ film is easily formed over an IDT electrode IDT and has a stable dielectric constant.

As described above, a surface acoustic wave resonator according to this embodiment has a configuration in which a dielectric film DF having a negative TCF is formed over a surface acoustic wave resonator having a positive TCF according to the first embodiment. Therefore, in the surface acoustic wave resonator according to this embodiment, it is possible to reduce the absolute value of the TCF as compared to that in the surface acoustic wave resonator according to the first embodiment. The rest of the configuration is similar to that of the surface acoustic wave resonator according to the first embodiment.

The present disclosure made by the inventors of the present application has been explained above in a concrete manner based on embodiments. However, the present disclosure is not limited to the above-described embodiments, and needless to say, various modifications can be made without departing from the spirit and scope of the present disclosure.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A surface acoustic wave resonator comprising
a quartz-crystal substrate; and
an IDT (Interdigital Transducer) electrode formed over the quartz-crystal substrate, wherein
the quartz-crystal substrate comprises:
an AT-cut 0° X-propagation first quartz-crystal substrate; and
a Z-cut second quartz-crystal substrate bonded over the first quartz-crystal substrate,
a propagation direction of a surface acoustic wave in the second quartz-crystal substrate is inclined from an X-axis of a crystal by 27 to 33°, 87 to 93°, or 147 to 153°, and
a thickness of the second quartz-crystal substrate is 0.2 to 1.0 times a wavelength of the surface acoustic wave.

2. The surface acoustic wave resonator according to claim 1, wherein the thickness of the second quartz-crystal substrate is 0.35 to 0.55 times the wavelength.

3. The surface acoustic wave resonator according to claim 1, further comprising a 5-64° Y-cut X-propagation $LiNbO_3$ substrate bonded to the second quartz-crystal substrate, wherein
the IDT electrode is formed over the $LiNbO_3$ substrate.

4. The surface acoustic wave resonator according to claim 3, wherein a thickness of the $LiNbO_3$ substrate is 0.1 to 0.7 times the wavelength.

5. The surface acoustic wave resonator according to claim 1, wherein the second quartz-crystal substrate and the IDT electrode are covered by a dielectric film having a temperature coefficient of frequency having a negative value.

6. The surface acoustic wave resonator according to claim 5, wherein the dielectric film is an $Al_2O_3$ film.

7. A method for manufacturing a surface acoustic wave resonator, comprising the steps of:
(a) bonding a Z-cut second quartz-crystal substrate over an AT-cut 0° X-propagation first quartz-crystal substrate; and
(b) forming an IDT (Interdigital Transducer) electrode over the second quartz-crystal substrate, wherein
a propagation direction of a surface acoustic wave in the second quartz-crystal substrate is inclined from an X-axis of a crystal by 27 to 33°, 87 to 93°, or 147 to 153°, and
a thickness of the second quartz-crystal substrate is 0.2 to 1.0 times a wavelength of the surface acoustic wave.

8. The method for manufacturing a surface acoustic wave resonator according to claim 7, wherein the thickness of the second quartz-crystal substrate is 0.35 to 0.55 times the wavelength.

9. The method for manufacturing a surface acoustic wave resonator according to claim 7, further comprising, between the steps (a) and (b), a step of bonding a 5-64° Y-cut X-propagation LiNbO$_3$ substrate over the second quartz-crystal substrate, wherein in the step (b), the IDT electrode is formed over the LiNbO$_3$ substrate.

10. The method for manufacturing a surface acoustic wave resonator according to claim 9, wherein the thickness of the LiNbO$_3$ substrate is 0.1 to 0.7 times the wavelength.

11. The method for manufacturing a surface acoustic wave resonator according to claim 7, further comprising, after the step (b), a step of covering the second quartz-crystal substrate and the IDT electrode by a dielectric film having a temperature coefficient of frequency having a negative value.

12. The method for manufacturing a surface acoustic wave resonator according to claim 11, wherein the dielectric film is an Al$_2$O$_3$ film.

13. A radio circuit comprising:
   a first amplifier configured to amplify a reception radio-frequency signal wirelessly received by an antenna;
   a second amplifier configured to amplify a transmission radio-frequency signal to be wirelessly transmitted from the antenna;
   a reception radio-frequency filter through which the reception radio-frequency signal amplified by the first amplifier passes; and
   a transmission radio-frequency filter through which the transmission radio-frequency signal to be input to the second amplifier passes, wherein
   at least one of the reception radio-frequency filter and the transmission radio-frequency filter includes a surface acoustic wave resonator,
   the surface acoustic wave resonator comprises:
      a quartz-crystal substrate; and
      an IDT (Interdigital Transducer) electrode formed over the quartz-crystal substrate,
   the quartz-crystal substrate comprises:
      an AT-cut 0° X-propagation first quartz-crystal substrate; and
      a Z-cut second quartz-crystal substrate bonded over the first quartz-crystal substrate,
   a propagation direction of a surface acoustic wave in the second quartz-crystal substrate is inclined from an X-axis of a crystal by 27 to 33°, 87 to 93°, or 147 to 153°, and
   a thickness of the second quartz-crystal substrate is 0.2 to 1.0 times a wavelength of the surface acoustic wave.

\* \* \* \* \*